(12) United States Patent
Koopman et al.

(10) Patent No.: US 7,251,958 B2
(45) Date of Patent: Aug. 7, 2007

(54) METHOD FOR TRANSPORTING GLAZING THROUGH A COATING-DEPOSITING PLANT

(75) Inventors: Dirk Koopman, Kaarst (DE); Richard Crumbach, Aachen (DE); Franz Kraemling, Aachen (DE); Michael Houlena, Stolberg (DE)

(73) Assignee: Saint-Gobain Glass France, Courbevoie (FR)

( * ) Notice: Subject to any disclaimer, the term of this patent is extended or adjusted under 35 U.S.C. 154(b) by 426 days.

(21) Appl. No.: 10/182,727

(22) PCT Filed: Feb. 7, 2001

(86) PCT No.: PCT/FR01/00354

§ 371 (c)(1),
(2), (4) Date: Nov. 22, 2002

(87) PCT Pub. No.: WO01/58818

PCT Pub. Date: Aug. 16, 2001

(65) Prior Publication Data

US 2004/0045320 A1    Mar. 11, 2004

(30) Foreign Application Priority Data

Feb. 11, 2000    (DE) ................. 100 06 121

(51) Int. Cl.
*C03C 17/00*    (2006.01)
*B65G 37/00*    (2006.01)

(52) U.S. Cl. ........................... 65/60.1; 65/111

(58) Field of Classification Search ................ 65/60.1, 65/106, 111, 102, 287; 427/331, 165; 156/99; 198/804, 844.1, 846
See application file for complete search history.

(56) References Cited

U.S. PATENT DOCUMENTS

| | | | | |
|---|---|---|---|---|
| 3,762,902 A | * | 10/1973 | Wagner et al. | 65/60.2 |
| 4,352,221 A | * | 10/1982 | Revells et al. | 15/77 |
| 4,536,204 A | * | 8/1985 | Van Laethem et al. | 65/60.4 |
| 4,749,397 A | * | 6/1988 | Chesworth et al. | 65/60.2 |
| 4,917,717 A | * | 4/1990 | Thomas et al. | 65/60.1 |
| 5,773,086 A | * | 6/1998 | McCurdy et al. | 427/255.19 |
| 5,992,178 A | * | 11/1999 | Kuster | 65/24 |
| 6,082,141 A | * | 7/2000 | Kuster | 65/289 |
| 2001/0007698 A1 | * | 7/2001 | Kutilek | 427/289 |
| 2004/0045320 A1 | * | 3/2004 | Koopmann et al. | 65/60.1 |

FOREIGN PATENT DOCUMENTS

| | | |
|---|---|---|
| EP | 0 570 260 | 11/1993 |
| EP | 0 839 769 | 5/1998 |
| JP | 64 003035 | 1/1989 |
| JP | 03 199141 | 8/1991 |

* cited by examiner

*Primary Examiner*—Carlos Lopez
(74) *Attorney, Agent, or Firm*—Oblon, Spivak, McClelland, Maier & Neustadt, P.C.

(57) ABSTRACT

A method for transporting a fixed glazing to be equipped with a coating, particularly a curved glazing, through a coating plant. The glazing is transported by a transport device through the plant such that one of its main sides is covered with protection against the coating substance that is to be deposited. The side of the glazing that is to be protected when the coating is being deposited is kept in contact with a flexible fabric attached to the transport device.

14 Claims, No Drawings

METHOD FOR TRANSPORTING GLAZING THROUGH A COATING-DEPOSITING PLANT

The invention relates to a method for transporting glazing, particularly curved glazing, to be coated, having the characteristics of the preamble of claim 1 and to a transport device suitable for implementing it, according to independent claim 8.

The term "glazing" is to be understood as meaning any substrate made of glass or combination of substrates comprising at least one substrate made of glass. The term "coating" is to be understood as meaning one or more thin layers (with thicknesses generally of between 0.5 and 300 nm in respect of each of the layers) of the metallic (silver) layer type, and/or layers of dielectric (of the metal oxide, silicon nitride, etc. type).

To coat glazing, particularly curved glazing, with thin layers using the method of magnetic-field enhanced sputtering (hereinafter referred to as "sputtering"), the glazing placed on support devices is transported through the plant in known devices, the operation of which is continuous. Inevitably, particles pulled away from the cathode are deposited on all the surfaces and all the objects that lie in the evacuated chamber in question.

As a general rule, the layer deposited by sputtering—or a collection of several layers produced one after the other—is to be deposited on just one of the sides of the glazing. It is therefore necessary to prevent particles of coating from being deposited on the other side (the "rear" side), the one which is not to be coated, so as to avoid post-deposition treatments such as the removal of particles of coating from the side in question which is to remain free of coating.

In the case of flat glazing, it is easy to cover the sides which are not to be coated: the glazing is transported on a flat conveyor through the sputtering chambers, if appropriate on another piece of flat glazing which acts as an intermediate support. During deposition of the coating, attempts have also been made at using, as intermediate supports, glazing that has the same curvature. This approach is not always applicable, because, on the one hand, the glazing needs to remain immobile during the coating operation and because, on the other hand, the side facing the conveyor is not entirely covered.

It is also possible to place the curved glazing on a box-type transport device which supports the glazing only along their edge—exactly as known bending frame forms—so that their rear side is masked and virtually forms a portion of the interior wall of the box. A disadvantage with this type of support is, however, that is to be very specially tailored to the outline of the type of glazing in question. In particular, the edge of the support has to exact follow the curved outline of the edge of the glazing. In vehicle glazing in particular, there is, however, an incalculable number of versions of glazing for each type of glazing (windscreen, rear screen, sunroof, quarter light, etc.), each having different contours and curvatures, which means that a number of a great many individual supports would need to be stored and used.

At the present time, the demand for coated curved glazing is still relatively low, which means that it is possible to produce only a relatively small number of each version of glazing. A frequent change in version, inevitable in such small production runs, for an industrial production of coatings is, however, complicated and expensive with the supports and transport devices currently available. In particular, the coating plant frequently has to be shut down, and the production run interrupted.

Coated glazing is generally then incorporated into laminated glazing, in which its uncoated side faces outwards. The coated surface of the glazing is covered and protected by the next layer of the composite (laminated glazing usually has the structure glass/possible coating/sheet of thermoplastic of the PVB type/glass).

Patent DE 196 43 935 C2 discloses, in the bending of glazing in a horizontal position, the use in at least two successive bending stations, of transport devices which have a carrier fabric arranged flexibly over a rigid carrier frame. The glazing placed on this carrier fabric is transported step by step through the bending plant, and is deformed in contact with the fabric. Use is preferably made of the conventionally commercially-available fabrics made up of heat-resistant metal fibres, which are also used in other fields particularly as liners for superficial and annular bending moulds. The object of this method is to avoid relative movements between the glazing heated to the softening temperature and the transport device, and to support the glazing over their entire surface during transport. Damage to the surface and undesirable deformations are thus avoided.

It is an object of the invention to propose a method for transporting glazing through a coating plant which allows more flexible use of the plant for the different shapes, sizes and curvatures of glazing, particularly curved glazing, without excessive expenditure, and a transport device suited to implementing this method.

According to the invention, this objective is achieved, as regards the method, by the characteristics of claim 1. The characteristics of independent claim 8 relate to a corresponding device. The characteristics of the dependent claims relate to advantageous variants of this method and of this device according to the invention.

Tests have shown that transporting the glazing that is to be coated with the side in contact with an appropriate fabric (preferably flat and flexible) that is sufficient impermeable is possible, and leads to the desired result, namely no coating particles being deposited on the side facing the fabric. The use of what is known as an overspray can thus be avoided. Furthermore, the fabric can also prevent particles of coating from being deposited on other parts of the coating plant, themselves also covered with the fabric.

By way of fabrics that can be used for this application, experiments have been carried out with commercially-available metal fabrics. Positive results have been obtained with fabrics by the company Paul, Metallgewebe—Filterfabrik (Industriegebiet West—D-36396 Steinau an der Strasse), described in the table below. These indications are, however, given merely by way of example and do not restrict the scope of the invention.

| Material 1.4401 | Material 1.4301 |
| --- | --- |
| Fabric No. 38 | Fabric No. 48 |
| Weave: plain | Weave: linen weave |
| Filament diameter: 0.165 mm | Filament diameter: 0.130 mm |
| Mesh μm: 503 | Mesh μm: 400 |

Nor is the transport method restricted to a use in the context of the sputtering method mentioned in the introduction of the present text.

The position in which the glazing is transported on the fabric through the coating plant is, theoretically, without importance, as long as there is surface contact between the fabric and the side of the glazing. This may occur under the action of gravity, when the glazing is in the horizontal position, or in a position slightly inclined with respect to the horizontal fabric.

Fabric/glass surface contact may be ensured or facilitated by appropriate holding or tensioning devices with which the glazing is pressed against the flexible face of the fabric. This is essential when the glazing is transported edge-on through the coating plant or even suspended, that is to say when the coating particles are sprayed towards the glazing against the force of gravity. In the latter instance, the fabric rests on the face of the glazing that is not to be covered. The glazing is fixed at its periphery by appropriate attachments.

In many instances, the coating is away from the edge of the glazing (set back from the edge face of the pane or panes of the glazing), this being to prevent the coating from corroding (particularly when it contains at least one layer of silver) starting from the edge of the laminated glazing. In particular, the glazing may be designed, for example, to allow reliable peripheral bonding of the coated glaze into the laminate or, for example, to a frame—for example a windscreen surround—or an interlayer in the case of insulating glazing. It is even possible, therefore, for said holding or tensioning devices to be mechanically hooked onto that side of the glazing that is to be coated, as long as they do not impinge on the side of the glazing beyond the zone that is to be kept free of coating.

When it is possible, in the plant, to determine the peripheral contour of the deposited glazing it is possible, depending on the type of these holding or tensioning devices, to envisage positioning them automatically at the edge of the glazing, something which avoids (or at least reduces) transformation expenditure in that respect.

Given that these fabrics with small mesh sizes offer relatively little resistance to the passage of air in the normal direction, the glazing may in theory also be sucked by suction cups, from the rear of the fabric, against the face of the fabric. A certain tension may thus be given to the fabric. This can be achieved by first of all setting the glazing down on the face of the fabric, then applying the suction cups and beginning to evacuate air, and finally backing the suction cups up slightly by a predetermined distance from the glazing they are holding. By comparison with mechanical tensioning devices hooked to the edge of the glazing, such suction cups have the advantage of not having to be positioned in such a precise way.

In a coating station that operates under vacuum, the suction cups cannot, however, any longer apply any holding force. Their use is, however, also possible here, in each case to ensure good surface contact when the glazing is being placed on the fabric. When the fabric has a certain amount of almost plastic deformability, the contour of each piece of curved glazing set down may be impressed into the fabric.

It goes without saying furthermore that, if need be, the transport device carrying the fabric may be equipped with tensioning devices which prevent the face of the fabric loaded with the glazing from sagging. At the same time, their tension force needs to be low enough (in any case for a support purely by gravity) to allow surface contact between the glazing and the fabric.

Particularly in the case where the face of the fabric forms part of a box or of a frame with closed sides and if ingress of coating particles through the sides is thus excluded, it is advantageously possible to have a cut-out in the fabric, so as to improve the mating or shaping of the surface of the fabric to the surface of the glazing.

On the one hand, it is preferable for this cut-out to be entirely covered by the smallest piece of glazing to be transported. In fact, in some cases, the cut-out may be almost as big as the surface of the glass, and in any case may represent at least 50 to 70% of the surface of the glass by which the fabric is in contact.

On the other hand, the face and the periphery of the box or of the frame need preferably to be larger than the face and the periphery of the largest piece of glazing that is to be transported. For other pieces of information needed for producing such transport devices, reference may be made, for example, to document DE 196 43 935 C2 already mentioned. As the fabric is impermeable, it is possible to avoid undesirable deposits of particles on the rear side of the glazing, also in the zone of the said cut-out. ("Impermeable" is to be understood as meaning the fact that the fabric does not allow the particles that may be emitted by the sputtering targets to pass, but the fabric may be permeable to gases, especially to air).

Of course, coating particles will also be deposited on the fabric itself and will stick to it. Periodic cleaning of the faces of the fabric by appropriate means (blasting, shaping, etc.) is therefore useful, so that the coating material will not be undesirably transferred from the face of the fabric onto the rear side of the glazing. Likewise, it is preferable for the fabrics to be changed periodically. The time needed for this maintenance work is, however, markedly less than the time that would need to be dedicated to changing the masks specific to the glazing in conventional plant, without support using fabric.

The size of the transport devices is, on the one hand, limited by the cross sections available in the coating plant. On the other hand, several differently profiled and/or curved pieces of glazing may be set down beside one another on the faces of the fabric, as long as there is contact between the glass of the rear side of the glazing and the fabric (possibly cut as mentioned above), so that a high production efficiency can be achieved, especially with glazing of relatively small surface area and/or for large cross sections in the coating-depositing plant.

The invention claimed is:

1. A method for transporting glazing that is to be coated, through a coating plant, comprising:
   transporting the glazing by a transport device through the coating plant, such that one of its main sides is at least partially covered with a protection against the coating substance that is to be applied,
   wherein during a coating-depositing operation, at least part of the side of the glazing that is to be protected is kept in contact with a flexible fabric attached to the transport device by mechanical tensioning devices hooked to one or more outer edges of the glazing to prevent a deposition of coating substance.

2. A method according to claim 1, wherein the fabric is equipped to increase its flexibility, with a cut, an outline of which is smaller than the outline of a smallest piece of fixed glazing that is to be transported.

3. A method according to claim 1, wherein contact between the glazing and a face of the fabric is improved by a mechanism to ensure application across an entire surface of the side.

4. A method according to claim 3, wherein contact between the glazing and the fabric is improved by local application of a partial vacuum from a rear of the face of the fabric.

5. A method according to claim 1, wherein the glazing is transported while placed on a slightly tensioned face of flexible fabric.

6. A method according to claim 3, wherein the glazing is transported in an upright position.

7. A method according to claim 1, wherein the glazing is a curved glazing.

8. A method for transporting glazing that is to be coated through a coating plant, comprising:
transporting the glazing by a transport device through the plant, such that a main side of the glazing is at least partially covered with a flexible fabric against the coating substance that is to be applied, wherein during a coating-depositing operation, a peripheral contour of the main side of the glazing is impressed into the flexible fabric attached to the transport device, wherein said fabric prevents deposition of coating substance on the main side.

9. A method according to claim 8, wherein the flexible fabric has a cut-out so as to improve mating or shaping of a surface of the fabric to the main side of the glazing.

10. A method according to claim 9, wherein a face of the fabric forms part of a box or frame with closed sides in order to prevent ingress of coating particles through the sides.

11. A method according to claim 10, wherein the cut-out in the flexible fabric is located at approximately a middle portion of the glazing.

12. A method according to claim 11, wherein the cut-out is approximately 50-70% of a size of the main side of the glazing that is at least partially covered with the flexible fabric.

13. A method according to claim 8, wherein contact between the glazing and the fabric is improved by mechanical tensioning devices hooked to an outer edge of the glazing.

14. A method according to claim 8, wherein a contour of the flexible fabric is substantially similar to the contour of the glazing.

* * * * *